US012574014B2

(12) United States Patent
Hiratsuka

(10) Patent No.: US 12,574,014 B2
(45) Date of Patent: \*Mar. 10, 2026

(54) LONGITUDINALLY COUPLED RESONATOR ACOUSTIC WAVE FILTER AND ACOUSTIC WAVE FILTER

(71) Applicant: Murata Manufacturing Co., Ltd., Nagaokakyo (JP)

(72) Inventor: Yuya Hiratsuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 258 days.

This patent is subject to a terminal disclaimer.

(21) Appl. No.: 18/122,745

(22) Filed: Mar. 17, 2023

(65) Prior Publication Data

US 2023/0223929 A1 Jul. 13, 2023

Related U.S. Application Data

(63) Continuation of application No. PCT/JP2021/033727, filed on Sep. 14, 2021.

(30) Foreign Application Priority Data

Sep. 29, 2020 (JP) ................................. 2020-163850

(51) Int. Cl.
*H03H 9/64* (2006.01)
*H03H 9/145* (2006.01)

(52) U.S. Cl.
CPC ...... *H03H 9/6423* (2013.01); *H03H 9/14538* (2013.01); *H03H 9/64* (2013.01)

(58) Field of Classification Search
CPC .............................. H03H 9/64; H03H 9/14538
(Continued)

(56) References Cited

U.S. PATENT DOCUMENTS 11,362,642 B2 \* 6/2022 Muranaka ............ H03H 9/6436
2008/0007370 A1 1/2008 Matsumoto
(Continued)

FOREIGN PATENT DOCUMENTS

CN 110771040 A 2/2020
JP 2017118587 A 6/2017
(Continued)

OTHER PUBLICATIONS

International Search Report in PCT/JP2021/033727, mailed on Nov. 30, 2021, 3 pages.
(Continued)

*Primary Examiner* — Andrea Lindgren Baltzell
*Assistant Examiner* — Abigail Amir Yaldo
(74) *Attorney, Agent, or Firm* — Keating & Bennett, LLP

(57) ABSTRACT

A longitudinally coupled resonator acoustic wave filter including IDT electrodes including a first IDT electrode and a second IDT electrode, and first and second reflectors, in which the IDT electrodes have respective hot-side comb-shaped electrodes and respective ground-side comb-shaped electrodes, the hot-side comb-shaped electrodes of the first IDT electrodes are electrically connected to at least one of the first and second reflectors, the second IDT electrodes are between the IDT electrode and the first reflector and between the IDT electrode and the second reflector respectively, the hot-side comb-shaped electrodes of the IDT electrodes are connected to one of an input end and an output end, and the hot-side comb-shaped electrodes of the IDT electrodes are connected to the other of the input end and the output end.

20 Claims, 5 Drawing Sheets

(58) Field of Classification Search
     USPC .......................................................... 333/193
     See application file for complete search history.

(56)                References Cited

U.S. PATENT DOCUMENTS

| | | |
|---|---|---|
| 2010/0045399 A1 | 2/2010 | Yasuda |
| 2012/0098618 A1 | 4/2012 | Tanaka |
| 2013/0187725 A1 | 7/2013 | Ikeuchi |
| 2016/0049920 A1 | 2/2016 | Kishino |
| 2019/0131955 A1 | 5/2019 | Kaneda |
| 2020/0112299 A1 | 4/2020 | Muranaka |
| 2020/0304096 A1 | 9/2020 | Suzuki et al. |

FOREIGN PATENT DOCUMENTS

| | | |
|---|---|---|
| WO | 2005101657 A1 | 10/2005 |
| WO | 2010150882 A1 | 12/2010 |
| WO | 2017221545 A1 | 12/2017 |
| WO | 2018117060 A1 | 6/2018 |
| WO | 2019123812 A1 | 6/2019 |

OTHER PUBLICATIONS

Written Opinion in PCT/JP2021/033727, mailed on Nov. 30, 2021, 3 pages.
Official Communication issued in corresponding Chinese Patent Application No. 202180064909.1, mailed on Jun. 24, 2025, 7 pages.

\* cited by examiner

LONGITUDINALLY COUPLED RESONATOR ACOUSTIC WAVE FILTER AND ACOUSTIC WAVE FILTER

CROSS REFERENCE TO RELATED APPLICATIONS

This application claims the benefit of priority to Japanese Patent Application No. 2020-163850 filed on Sep. 29, 2020 and is a Continuation application of PCT Application No. PCT/JP2021/033727 filed on Sep. 14, 2021. The entire contents of each application are hereby incorporated herein by reference.

BACKGROUND OF THE INVENTION

1. Field of the Invention

The present invention relates to a longitudinally coupled resonator acoustic wave filter that includes a plurality of IDT electrodes and first and second reflectors, and relates to an acoustic wave filter including the longitudinally coupled resonator acoustic wave filter.

2. Description of the Related Art

Longitudinally coupled resonator acoustic wave filters are conventionally known to have structures including connected bridge capacitances. For example, in International Publication No. 2005/101657, an attenuation pole near the high frequency side of a pass band of a filter is brought closer to the pass band by connecting a bridge capacitance. Accordingly, attenuation characteristics are improved on the high frequency side of the pass band.

The above-mentioned bridge capacitance is connected in parallel with the longitudinally coupled resonator acoustic wave filter between an input end and an output end of the longitudinally coupled resonator acoustic wave filter.

SUMMARY OF THE INVENTION

When the above-mentioned bridge capacitance is provided, the bridge capacitance needs to be configured on a chip surface. An area of the chip surface is accordingly increased by the amount of the bridge capacitance provided. This causes a problem in that the size of a longitudinally coupled resonator acoustic wave filter is increased.

Preferred embodiments of the present invention provide longitudinally coupled resonator acoustic wave filters and acoustic wave filters that each improve attenuation characteristics on a high frequency side of a pass band without causing size increase.

A longitudinally coupled resonator acoustic wave filter according to a preferred embodiment of the present invention includes a plurality of IDT electrodes that include a first IDT electrode and a second IDT electrode, and a first reflector and a second reflector that are provided on respective sides of the plurality of IDT electrodes in an acoustic wave propagating direction. Each of the plurality of IDT electrodes has a hot-side comb-shaped electrode which is connected to a hot-side potential, and a ground-side comb-shaped electrode which is connected to a ground-side potential. The hot-side comb-shaped electrode of the first IDT electrode is electrically connected to at least one of the first reflector and the second reflector. The second IDT electrode is arranged between the first IDT electrode and at least one of the first reflector and the second reflector, to which the hot-side comb-shaped electrode of the first IDT electrode is connected. The hot-side comb-shaped electrode of the first IDT electrode is connected to one of an input end and an output end and a comb-shaped electrode, which is connected to the hot-side potential, of the second IDT electrode is connected to the other of the input end and the output end.

According to preferred embodiments of the present invention, longitudinally coupled resonator acoustic wave filters and acoustic wave filters that each improve attenuation characteristics on a high frequency side of a pass band without causing size increase can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the accompanying drawings.

It should be noted that each of the preferred embodiments described in the present specification is exemplary and that configurations can be partially exchanged or combined with each other between different preferred embodiments.

Figure 1:
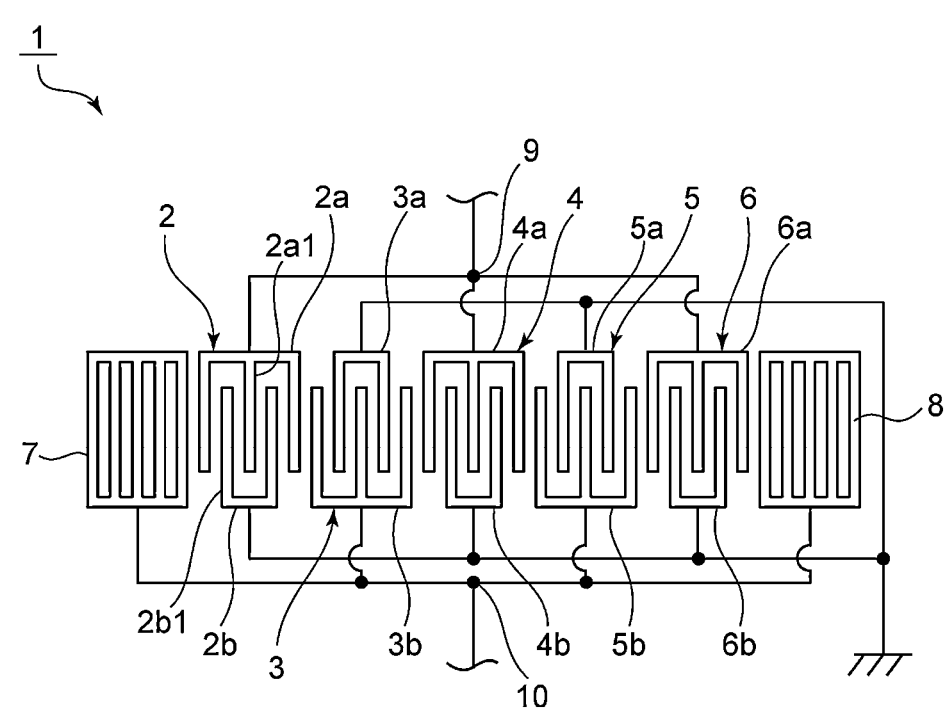
FIG. 1 is a circuit diagram of a longitudinally coupled resonator acoustic wave filter according to a first preferred embodiment of the present invention.
Figure 2:
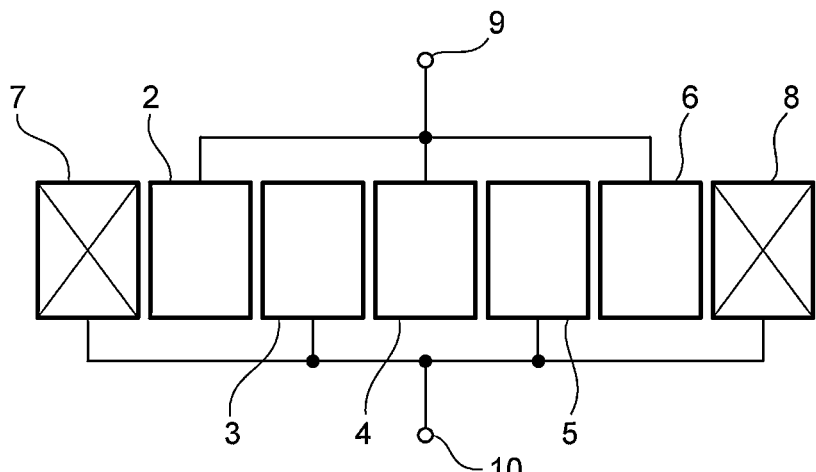
FIG. 2 is a schematic circuit diagram of the longitudinally coupled resonator acoustic wave filter according to the first preferred embodiment of the present invention.

FIG. 1 is a circuit diagram of a longitudinally coupled resonator acoustic wave filter according to a first preferred embodiment of the present invention. FIG. 2 is a schematic circuit diagram of this longitudinally coupled resonator acoustic wave filter.

As illustrated in FIG. 1, a longitudinally coupled resonator acoustic wave filter 1 includes a plurality of IDT electrodes 2 to 6. The IDT electrodes 2 to 6 are aligned along an acoustic wave propagating direction. Here, the acoustic wave propagating direction is a direction that is orthogonal to an extending direction of electrode fingers of the IDT electrodes 2 to 6.

First and second reflectors 7 and 8 are provided on respective sides of a region, in which the IDT electrodes 2 to 6 are provided, in the acoustic wave propagating direction.

Thus, the longitudinally coupled resonator acoustic wave filter 1 is a 5-IDT-type longitudinally coupled resonator acoustic wave filter including five pieces of IDT electrodes 2 to 6.

The longitudinally coupled resonator acoustic wave filter 1 is a reception filter of Band 20. Accordingly, the reception band is from about 791 MHz to about 821 MHz, for example.

An input terminal 9 is connected to an antenna terminal. An output terminal 10 is a reception terminal and outputs a received signal.

The IDT electrodes 2 to 6 include pairs of comb-shaped electrodes 2a and 2b to 6a and 6b respectively. Taking the IDT electrode 2 as an example, the comb-shaped electrode 2a includes a plurality of first electrode fingers 2a1. The comb-shaped electrode 2b includes a plurality of second electrode fingers 2b1. The plurality of first electrode fingers 2a1 and the plurality of second electrode fingers 2b1 are interdigitated. A direction orthogonal to the extending directions of the first electrode finger 2a1 and the second electrode finger 2b1 is the above-mentioned acoustic wave propagating direction.

The comb-shaped electrodes 3a and 3b to 6a and 6b of the IDT electrodes 3 to 6 also have similar structures to the comb-shaped electrodes 2a and 2b.

The first and second reflectors 7 and 8 have the structures to short-circuit both ends of the plurality of electrode fingers. That is, the first and second reflectors 7 and 8 are grating reflectors.

In the longitudinally coupled resonator acoustic wave filter 1, the comb-shaped electrode 2a of the IDT electrode 2, the comb-shaped electrode 4a of the IDT electrode 4, and the comb-shaped electrode 6a of the IDT electrode 6 are connected to the input terminal 9. That is, the comb-shaped electrodes 2a, 4a, and 6a are connected to a hot-side potential. On the other hand, the comb-shaped electrodes 2b, 4b, and 6b are connected in common and connected to a ground-side potential. Accordingly, the comb-shaped electrodes 2a, 4a, and 6a are hot-side comb-shaped electrodes in the IDT electrodes 2, 4, and 6, while the comb-shaped electrodes 2b, 4b, and 6b are ground-side comb-shaped electrodes.

On the other hand, the comb-shaped electrodes 3b and 5b of the IDT electrodes 3 and 5 are connected in common and connected to the output terminal 10. The comb-shaped electrodes 3a and 5a are connected in common and connected to the ground-side potential. Thus, the comb-shaped electrodes 3b and 5b are hot-side comb-shaped electrodes and the comb-shaped electrodes 3a and 5a are ground-side comb-shaped electrodes in the IDT electrodes 3 and 5.

Some of the unique features of the longitudinally coupled resonator acoustic wave filter 1 include the following 1) to 4). 1) The hot-side comb-shaped electrodes 3b and 5b of the IDT electrodes 3 and 5, which correspond to first IDT electrodes according to a preferred embodiment of the present invention, are connected with the first reflector 7 and the second reflector 8. 2) Between the IDT electrode 3, which corresponds to the first IDT electrode, and the first reflector 7 and between the IDT electrode 5, which corresponds to the first IDT electrode, and the second reflector 8, the IDT electrodes 2 and 6 which correspond to second IDT electrodes are arranged respectively. 3) The hot-side comb-shaped electrodes 3b and 5b of the IDT electrodes 3 and 5 corresponding to the first IDT electrodes are connected to the output terminal 10. 4) The hot-side comb-shaped electrodes 2a and 6a of the IDT electrodes 2 and 6 corresponding to the second IDT electrodes are connected to the input terminal 9. With this configuration, attenuation characteristics are improved on the high frequency side of a pass band. This will be clarified by showing characteristics of specific first example and first comparative example.

Figure 3:
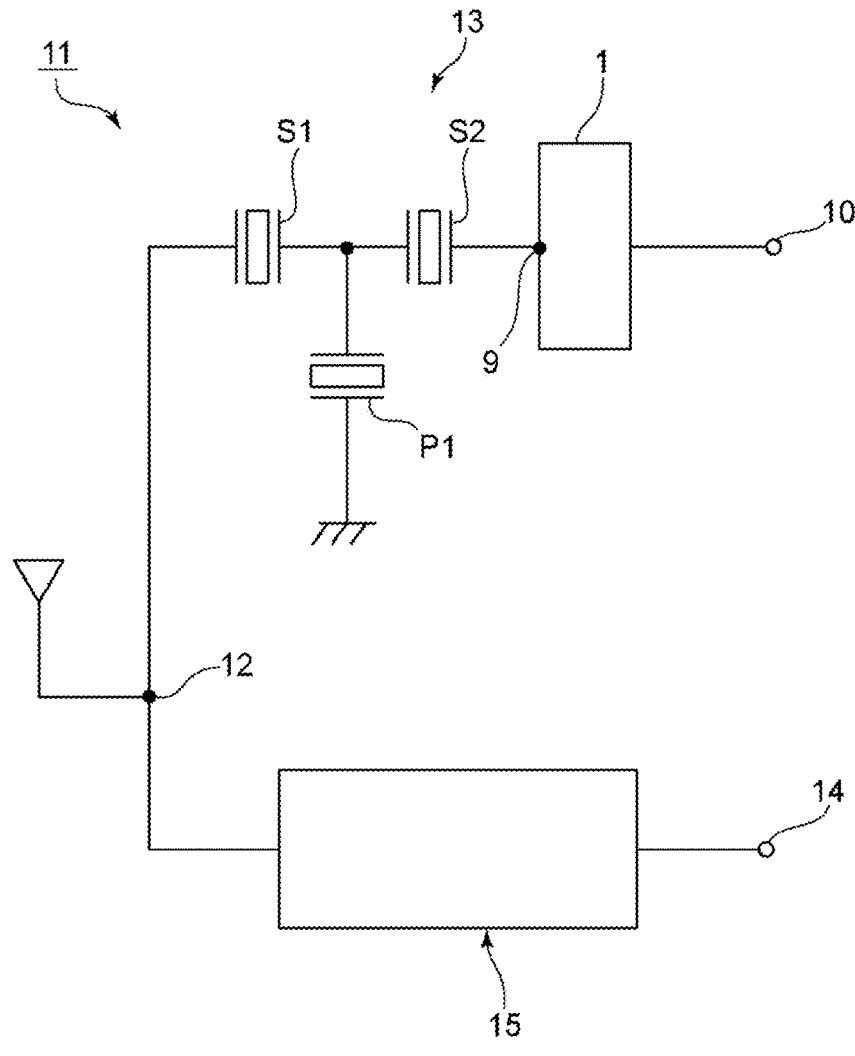
FIG. 3 is a circuit diagram illustrating a composite filter device including the longitudinally coupled resonator acoustic wave filter according to the first preferred embodiment of the present invention.

FIG. 3 is a circuit diagram illustrating a composite filter device 11 including the longitudinally coupled resonator acoustic wave filter 1 according to the first preferred embodiment of the present invention.

The composite filter device 11 includes an antenna terminal 12. The antenna terminal 12 is connected to an antenna. A reception filter 13 is connected between the antenna terminal 12 and the output terminal 10. A transmission filter 15 is connected between the antenna terminal 12 and a transmission terminal 14. The composite filter device 11 is a duplexer including the reception filter 13 and the transmission filter 15.

Here, in the composite filter device 11, one or two or more other band pass filters may be connected as well as the reception filter 13 and the transmission filter 15. That is, the composite filter device 11 may be a multiplexer such as a triplexer.

The reception filter 13 includes series arm resonators S1 and S2 that are connected in series with the longitudinally coupled resonator acoustic wave filter 1. Further, a parallel arm resonator P1 is connected between a connection point, which is between the series arm resonator S1 and the series arm resonator S2, and a ground-side potential. The reception filter 13 is an acoustic wave filter according to a preferred embodiment of the present invention. However, the acoustic wave filters according to preferred embodiments of the present invention is not limited to a reception filter.

The longitudinally coupled resonator acoustic wave filter 1 of the first preferred embodiment was configured as a first example. A longitudinally coupled resonator acoustic wave filter of the first comparative example was configured in a similar manner to the above-mentioned first example other than the configuration, for comparison, in which the first and second reflectors 7 and 8 were not electrically connected with the hot-side comb-shaped electrodes 3b and 5b of the IDT electrodes 3 and 5, thus being connected with nothing.

Figure 4:
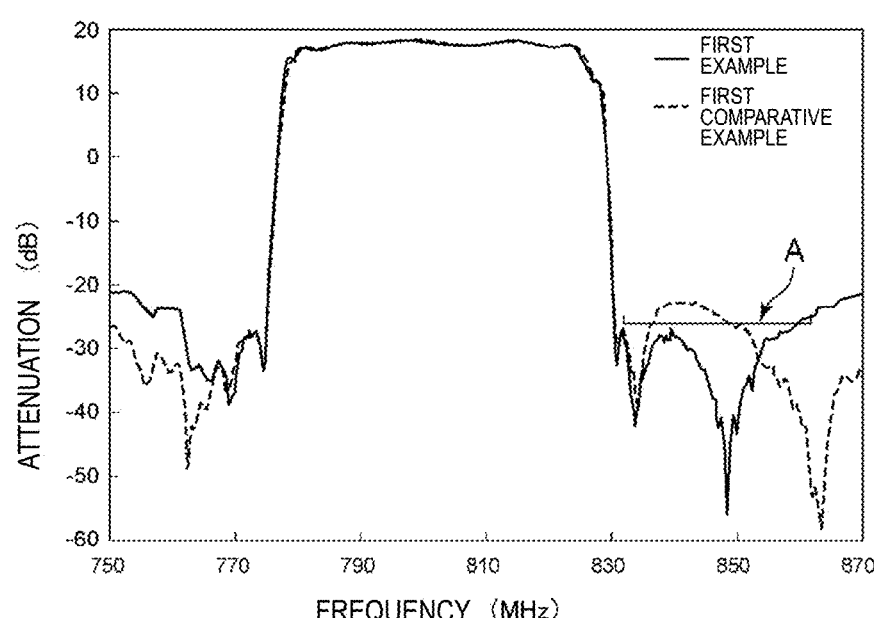
FIG. 4 is a graph showing attenuation-frequency characteristics of reception filters of a first example and a first comparative example including longitudinally coupled resonator acoustic wave filters of the first example and the first comparative example.

FIG. 4 shows attenuation-frequency characteristics of reception filters of the first example and the first comparative example including the respective longitudinally coupled resonator acoustic wave filters of the first example and the first comparative example. A solid line in FIG. 4 indicates the attenuation-frequency characteristics of the reception filter of the first example and a dashed line indicates the attenuation-frequency characteristics of the first comparative example.

Apparent from FIG. 4, large attenuation is obtained between about 830 MHz and about 855 MHz on the high frequency side of the pass band in the first example compared to the first comparative example. Thus, the attenuation characteristics are effectively improved on the high frequency side of the pass band. A frequency range A in FIG. 4 is the pass band on the transmission side of Band 20. Accordingly, the first example shows that it is possible to provide a reception filter of Band 20 in which sufficient attenuation is ensured in the pass band on the transmission side of Band 20.

It is considered that attenuation was able to be improved on the high frequency side of the pass band in the first example as mentioned above because capacitance generated between the input terminal 9 and the output terminal 10 was increased. Examples of the capacitance here include capacitance of characteristic impedance generated by providing wiring on a piezoelectric substrate and capacitance generated between a plurality of IDT electrodes which are adjacent to each other.

The capacitance components preferably are provided by connecting the first IDT electrodes which are not adjacent to the first and second reflectors 7 and 8, that is, wiring on the hot side of the IDT electrodes 3 and 5 of the present preferred embodiment with the first and second reflectors 7 and 8. This is considered to bring an attenuation pole closer to the pass band, thus increasing the attenuation near the pass band on the high frequency side of the pass band.

The capacitance components are utilized by the above-mentioned electrical connection structure in a preferred embodiment of the present invention, as described above. This eliminates the need for providing a capacitor for separately configuring a bridge capacitance on a piezoelectric substrate. Accordingly, attenuation characteristics can be improved on the high frequency side of a pass band without causing size increase.

The hot-side comb-shaped electrodes 3b and 5b of the IDT electrodes 3 and 5, serving as the first IDT electrodes, are commonly connected with the first and second reflectors 7 and 8 and connected to the output terminal 10, in the first preferred embodiment. However, the present invention is not limited to such a connection structure. Second to fifth preferred embodiments will be described below.

In the second to fifth preferred embodiments, circuit configurations will be illustrated in schematic circuit diagrams as in FIG. 2.

Figure 5:
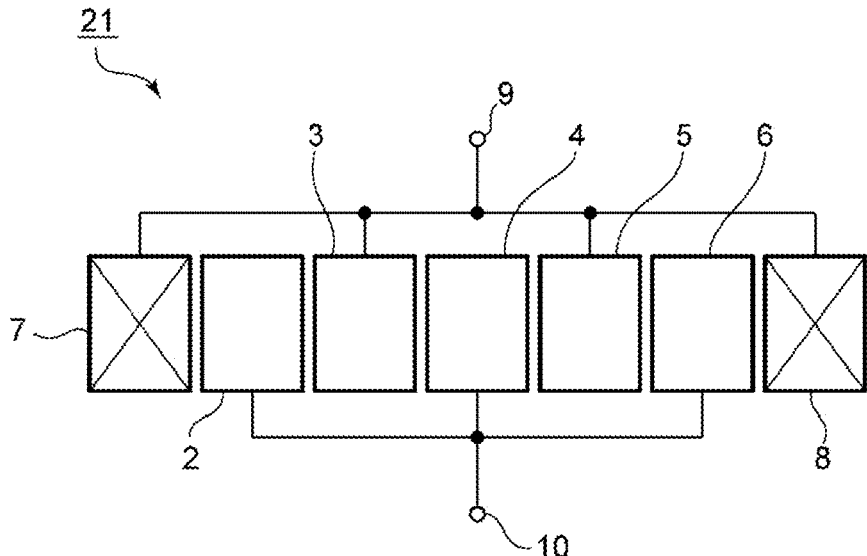
FIG. 5 is a schematic circuit diagram of a longitudinally coupled resonator acoustic wave filter according to a second preferred embodiment of the present invention.

FIG. 5 is a schematic circuit diagram of a longitudinally coupled resonator acoustic wave filter according to the second preferred embodiment of the present invention. In a longitudinally coupled resonator acoustic wave filter 21 according to the second preferred embodiment, five pieces of IDT electrodes 2 to 6 are arranged in the acoustic wave propagating direction. The first and second reflectors 7 and 8 are arranged on respective sides of a region in which the IDT electrodes 2 to 6 are provided. The IDT electrodes 2 and 6 which correspond to the second IDT electrodes are arranged between the IDT electrode 3, which corresponds to the first IDT electrode, and the first reflector 7 and between the IDT electrode 5, which corresponds to the first IDT electrode, and the second reflector 8 respectively, in the longitudinally coupled resonator acoustic wave filter 21. The difference from the first preferred embodiment is that hot-side comb-shaped electrodes, which are connected to the input terminal 9, of the IDT electrodes 3 and 5 are electrically connected with the first and second reflectors 7 and 8. That is, the hot-side comb-shaped electrodes of the IDT electrodes 3 and 5 are connected to the input terminal 9. The first and second reflectors 7 and 8 are also connected to the input terminal 9. Hot-side comb-shaped electrodes of the IDT electrodes 2, 4, and 6 are connected to the output terminal 10.

In a preferred embodiment of the present invention, a hot-side comb-shaped electrode of the first IDT electrode may be thus connected to the input terminal 9 and in this configuration, a hot-side comb-shaped electrode of the second IDT electrode is connected to the output terminal 10.

Other configurations of the longitudinally coupled resonator acoustic wave filter 21 are the same as those of the longitudinally coupled resonator acoustic wave filter 1.

A reception filter of a second example including the longitudinally coupled resonator acoustic wave filter 21 was configured similarly to the first example. However, electrode fingers of the IDT electrodes 2 and 6 respectively adjacent to the first and second reflectors 7 and 8 are electrode fingers that are connected to the ground-side potential, in the longitudinally coupled resonator acoustic wave filter 21 in the second example.

As a second comparative example, a reception filter was configured similarly to that of the second example other than a configuration in which the first and second reflectors 7 and 8 of the longitudinally coupled resonator acoustic wave filter in the reception filter of the above-mentioned second example were not electrically connected with the hot-side comb-shaped electrodes of the IDT electrodes 3 and 5.

Figure 6:
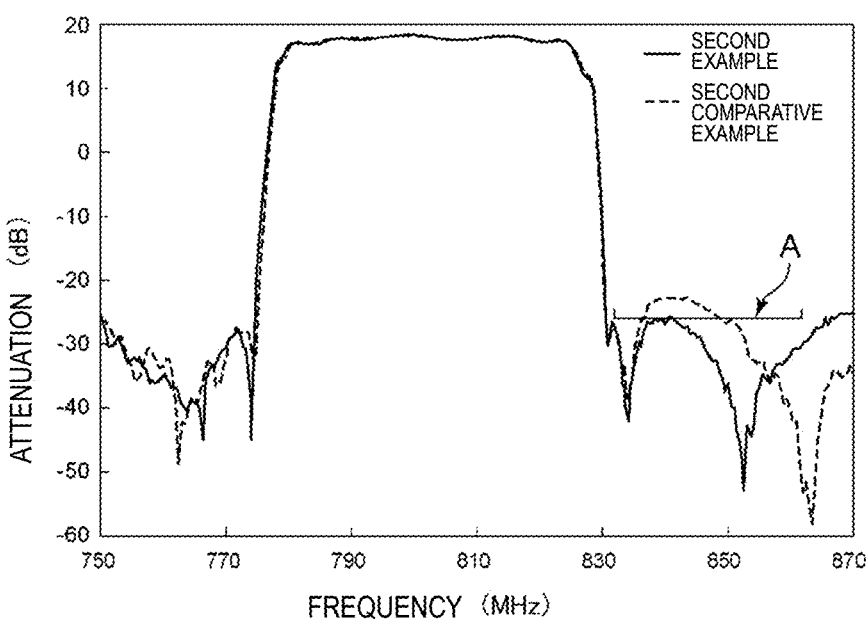
FIG. 6 is a graph showing attenuation-frequency characteristics of reception filters of a second example and a second comparative example.

FIG. 6 is a graph showing attenuation-frequency characteristics of reception filters of a second example and a second comparative example. A solid line indicates a result of the second example, and a dashed line indicates a result of the second comparative example.

The frequency range A in FIG. 6 indicates the pass band of the transmission filter of Band 20.

Apparent from FIG. 6, in the second example as well, the attenuation is sufficiently large on the high frequency side of a pass band, especially in the transmission band of Band 20, compared to the second comparative example. Accordingly, this shows that attenuation can be increased on the high frequency side of a pass band without causing size increase, similarly to the first example.

However, when compared to the first example of FIG. 4, the second example provides the smaller improvement effect of attenuation on the high frequency side of a pass band. It can be considered that this is because the polarity of the electrode fingers of the IDT electrodes 2 and 6, which are adjacent to the first and second reflectors 7 and 8 respectively, is set to a ground-side potential and accordingly, the effect of bringing the attenuation pole closer to a pass band is reduced.

Figure 7:
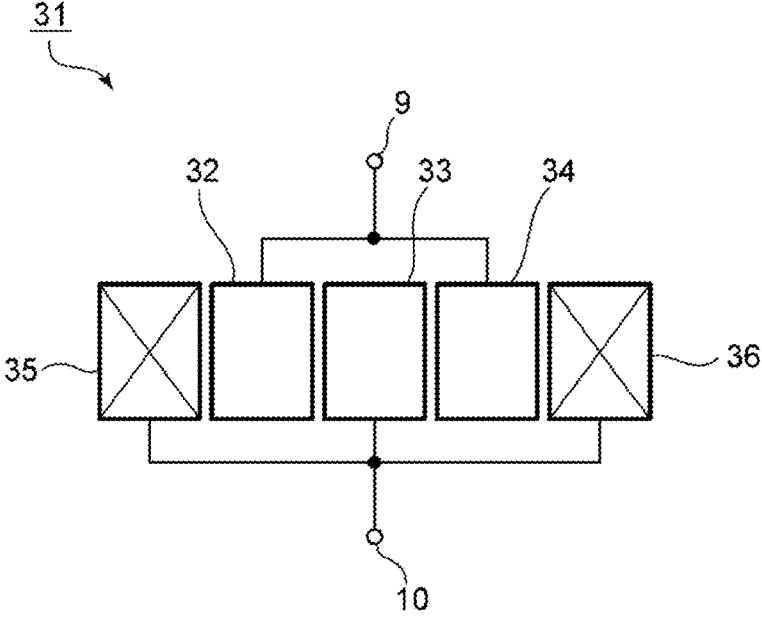
FIG. 7 is a schematic circuit diagram of a longitudinally coupled resonator acoustic wave filter according to a third preferred embodiment of the present invention.

FIG. 7 is a schematic circuit diagram of a longitudinally coupled resonator acoustic wave filter according to the third preferred embodiment of the present invention.

A longitudinally coupled resonator acoustic wave filter 31 includes three pieces of IDT electrodes 32 to 34. First and second reflectors 35 and 36 are provided on respective sides of a region in which the IDT electrodes 32 to 34 are provided. In a preferred embodiment of the present invention, the number of a plurality of IDT electrodes in a longitudinally coupled resonator acoustic wave filter is not especially limited and a 3-IDT-type longitudinally coupled resonator acoustic wave filter may be employed.

In the configuration here, the IDT electrode 33 corresponds to the first IDT electrode and the IDT electrode 32 which corresponds to the second IDT electrode is arranged between the IDT electrode 33 and the first reflector 35. Further, the IDT electrode 34 which corresponds to the second IDT electrode is arranged between the IDT electrode 33, which corresponds to the first IDT electrode, and the second reflector 36.

A hot-side comb-shaped electrode, which is connected to the output terminal 10, of the IDT electrode 33 is connected to the first and second reflectors 35 and 36. Accordingly, in the present preferred embodiment as well, attenuation on the high frequency side of a pass band can be improved as is the case with the first and second preferred embodiments.

Figure 8:
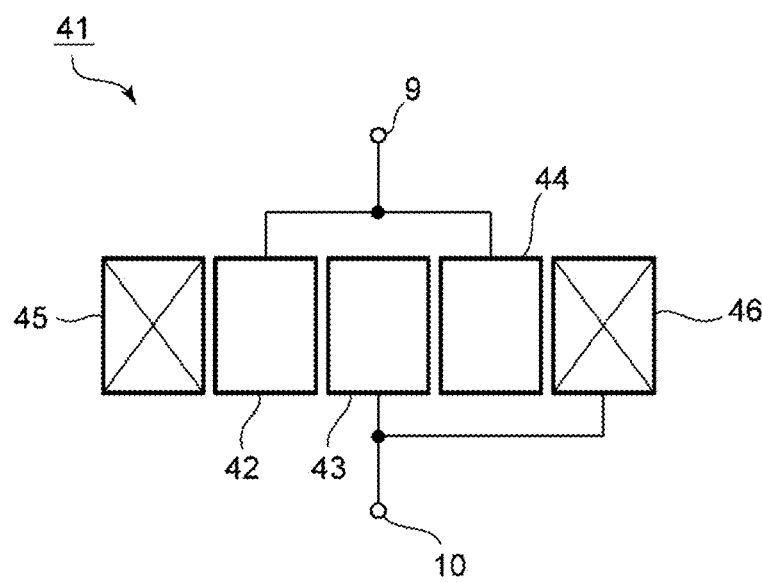
FIG. 8 is a schematic circuit diagram of a longitudinally coupled resonator acoustic wave filter according to a fourth preferred embodiment of the present invention.

FIG. 8 is a schematic circuit diagram of a longitudinally coupled resonator acoustic wave filter according to the fourth preferred embodiment of the present invention.

A longitudinally coupled resonator acoustic wave filter 41 includes three pieces of IDT electrodes 42 to 44 and first and second reflectors 45 and 46. The longitudinally coupled resonator acoustic wave filter 41 is thus a 3-IDT-type longitudinally coupled resonator acoustic wave filter.

The IDT electrode 44 which corresponds to the second IDT electrode is arranged between the IDT electrode 43, which corresponds to the first IDT electrode, and the second reflector 46. In this configuration, a comb-shaped electrode, which is connected to the output terminal 10, of the IDT electrode 43, that is, a hot-side comb-shaped electrode is connected to the second reflector 46.

Accordingly, attenuation on the high frequency side of a pass band can be improved as is the case with the first to third preferred embodiments.

Here, the first reflector 45 is not connected with the IDT electrode 43 which corresponds to the first IDT electrode. Thus, only the second reflector 46 of the first and second reflectors 45 and 46 may be connected to a hot-side comb-shaped electrode of the first IDT electrode.

That is, at least one of the first and second reflectors may be connected to a hot-side comb-shaped electrode of the first IDT electrode, in a preferred embodiment of the present invention. Attenuation on the high frequency side of a pass band can be also improved in this configuration.

Figure 9:
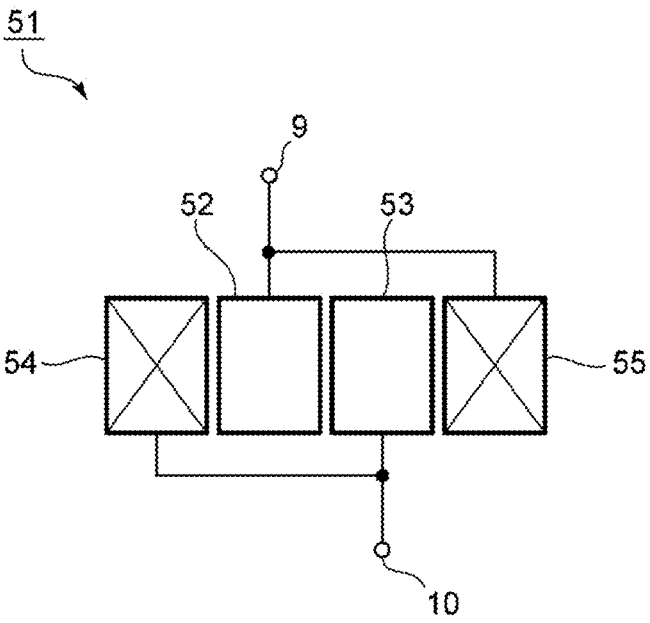
FIG. 9 is a schematic circuit diagram of a longitudinally coupled resonator acoustic wave filter according to a fifth preferred embodiment of the present invention.

FIG. 9 is a schematic circuit diagram of a longitudinally coupled resonator acoustic wave filter according to the fifth preferred embodiment of the present invention.

A longitudinally coupled resonator acoustic wave filter 51 includes two pieces of IDT electrodes 52 and 53. First and second reflectors 54 and 55 are provided on respective sides of a region in which the IDT electrodes 52 and 53 are provided. Thus, the number of a plurality of IDT electrodes 52 and 53 may be an even number, in a preferred embodiment of the present invention.

In the longitudinally coupled resonator acoustic wave filter 51, the second reflector 55 is connected to a hot-side comb-shaped electrode of the IDT electrode 52 on the side closer to the input terminal 9. Thus, the IDT electrode 52 corresponds to the first IDT electrode and the IDT electrode 53 corresponds to the second IDT electrode on the side closer to the input terminal 9. Attenuation on the high frequency side of a pass band can be accordingly improved.

In addition, a hot-side comb-shaped electrode of the IDT electrode 53 is connected with the first reflector 54, on the side closer to the output terminal 10. In this configuration, the IDT electrode 53 corresponds to the first IDT electrode and the IDT electrode 52 corresponds to the second IDT electrode, on the side closer to the output terminal 10.

Accordingly, attenuation on the high frequency side of a pass band can be improved by the above-mentioned electrical connection structure on the side closer to the output terminal 10.

As described above, the number of a plurality of IDT electrodes may be an odd number or an even number, in a preferred embodiment of the present invention. When m pieces (m is an even number) of IDT electrodes are provided as in the present preferred embodiment, an IDT electrode adjacent to the first reflector is the second IDT electrode and an IDT electrode located on a side, which is opposite to a side on which the first reflector is located, of the second IDT electrode corresponds to the first IDT electrode, among the m pieces of IDT electrodes.

Further, in a structure in which a plurality of IDT electrodes are n pieces (n is an odd number) of IDT electrodes and the n pieces of IDT electrodes are aligned from the first reflector side to the second reflector side, an IDT electrode located at an even-numbered position from the first reflector side is the first IDT electrode and IDT electrodes which are adjacent to the first and second reflectors and located at odd-numbered positions are the second IDT electrodes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A longitudinally coupled resonator acoustic wave filter comprising:

a plurality of IDT electrodes that include a first IDT electrode and a second IDT electrode; and a first reflector and a second reflector that are provided on respective sides of the plurality of IDT electrodes in an acoustic wave propagating direction; wherein each of the plurality of IDT electrodes includes a hot-side comb-shaped electrode connected to a hot-side potential, and a ground-side comb-shaped electrode connected to a ground-side potential;

separately from the ground-side comb-shaped electrode of the first IDT electrode, the hot-side comb-shaped electrode of the first IDT electrode is electrically connected to at least one of the first reflector and the second reflector;

the second IDT electrode is between the first IDT electrode and at least one of the first reflector and the second reflector, to which the hot-side comb-shaped electrode of the first IDT electrode is connected; and the hot-side comb-shaped electrode of the first IDT electrode is connected to one of an input end and an output end and a comb-shaped electrode, which is connected to the hot-side potential, of the second IDT electrode is connected to the other of the input end and the output end.

2. The longitudinally coupled resonator acoustic wave filter according to claim 1, wherein the first IDT electrode is electrically connected to one of the first reflector and the second reflector.

3. The longitudinally coupled resonator acoustic wave filter according to claim 1, wherein the first IDT electrode is electrically connected to both of the first reflector and the second reflector.

4. The longitudinally coupled resonator acoustic wave filter according to claim 1, wherein the second IDT electrode is adjacent to at least one of the first reflector and the second reflector, to which the hot-side comb-shaped electrode of the first IDT electrode is connected; and an electrode finger in the second IDT electrode, the electrode finger being adjacent to the first reflector or the second reflector, is connected to a hot-side potential.

5. The longitudinally coupled resonator acoustic wave filter according to claim 1, wherein the second IDT electrode is adjacent to at least one of the first reflector and the second reflector, to which the hot-side comb-shaped electrode of the first IDT electrode is connected; and an electrode finger in the second IDT electrode, the electrode finger being adjacent to the first reflector or the second reflector, is connected to a ground-side potential.

6. The longitudinally coupled resonator acoustic wave filter according to claim 1, wherein the plurality of IDT electrodes include n pieces of IDT electrodes where n is an odd number, and among the n pieces of IDT electrodes, an IDT electrode of the IDT electrodes that is located at an even-numbered position from a side closer to the first reflector is the first IDT electrode and an IDT electrode of the IDT electrodes that is adjacent to the first reflector or the second reflector and located at an odd-numbered position is the second IDT electrode.

7. The longitudinally coupled resonator acoustic wave filter according to claim 6, wherein the hot-side comb-shaped electrode of the first IDT electrode is connected to an output end and the hot-side comb-shaped electrode of the second IDT electrode is connected to an input end.

8. The longitudinally coupled resonator acoustic wave filter according to claim 7, wherein n is 3.

9. The longitudinally coupled resonator acoustic wave filter according to claim 7, wherein n is 5.

10. The longitudinally coupled resonator acoustic wave filter according to claim 6, wherein the hot-side comb-shaped electrode of the first IDT electrode is connected to an input end and the hot-side comb-shaped electrode of the second IDT electrode is connected to an output end.

11. The longitudinally coupled resonator acoustic wave filter according to claim 1, wherein the plurality of IDT electrodes include m pieces of IDT electrodes where m is an even number, and among the m pieces of IDT electrodes, an IDT electrode of the IDT electrodes that is adjacent to the first reflector is the second IDT electrode and an IDT electrode that is located on a side, the side being opposite to a side on which the first reflector is located, of the second IDT electrode is the first IDT electrode.

12. The longitudinally coupled resonator acoustic wave filter according to claim 11, wherein m is 2, the first IDT electrode is connected to the first reflector and is adjacent to the second reflector, and the second reflector is connected with the second IDT electrode.

13. An acoustic wave filter comprising:

a series arm that couples an input end and an output end to each other; wherein the longitudinally coupled resonator acoustic wave filter according to claim 1 and a series arm resonator are connected in series on the series arm, and at least one parallel arm resonator is connected between the series arm and a ground-side potential.

14. The acoustic wave filter according to claim 13, wherein the first IDT electrode is electrically connected to one of the first reflector and the second reflector.

15. The acoustic wave filter according to claim 13, wherein the first IDT electrode is electrically connected to both of the first reflector and the second reflector.

16. The acoustic wave filter according to claim 13, wherein the second IDT electrode is adjacent to at least one of the first reflector and the second reflector, to which the hot-side comb-shaped electrode of the first IDT electrode is connected; and an electrode finger in the second IDT electrode, the electrode finger being adjacent to the first reflector or the second reflector, is connected to a hot-side potential.

17. The acoustic wave filter according to claim 13, wherein the second IDT electrode is adjacent to at least one of the first reflector and the second reflector, to which the hot-side comb-shaped electrode of the first IDT electrode is connected; and an electrode finger in the second IDT electrode, the electrode finger being adjacent to the first reflector or the second reflector, is connected to a ground-side potential.

18. The acoustic wave filter according to claim 13, wherein the plurality of IDT electrodes include n pieces of IDT electrodes where n is an odd number, and among the n pieces of IDT electrodes, an IDT electrode of the IDT electrodes that is located at an even-numbered position from a side closer to the first reflector is the first IDT electrode and an IDT electrode of the IDT electrodes that is adjacent to the first reflector or the second reflector and located at an odd-numbered position is the second IDT electrode.

19. The acoustic wave filter according to claim 18, wherein the hot-side comb-shaped electrode of the first IDT electrode is connected to an output end and the hot-side comb-shaped electrode of the second IDT electrode is connected to an input end.

20. The acoustic wave filter according to claim 18, wherein the hot-side comb-shaped electrode of the first IDT electrode is connected to an input end and the hot-side comb-shaped electrode of the second IDT electrode is connected to an output end.

* * * * *